US008288741B1

(12) United States Patent
Miller et al.

(10) Patent No.: US 8,288,741 B1
(45) Date of Patent: Oct. 16, 2012

(54) APPARATUS AND METHOD FOR THREE DIMENSIONAL ION PROCESSING

(75) Inventors: Timothy J. Miller, Ipswich, MA (US); Ludovic Godet, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/210,959

(22) Filed: Aug. 16, 2011

(51) Int. Cl.
*G21K 5/10* (2006.01)
*H01J 37/08* (2006.01)

(52) U.S. Cl. ......... 250/492.21; 250/492.22; 250/492.23; 315/111.21; 315/111.31; 313/363.1

(58) Field of Classification Search .............. 250/423 R, 250/424, 492.1, 492.21, 492.22, 492.23, 250/492.3; 315/111.21, 111.31, 111.81; 313/363.1; 438/961
See application file for complete search history.

(56) References Cited

U.S. PATENT DOCUMENTS

| | | | | |
|---|---|---|---|---|
| 7,547,460 | B2 * | 6/2009 | Cucchetti et al. | 427/8 |
| 7,755,066 | B2 * | 7/2010 | Evans | 250/492.21 |
| 7,767,977 | B1 * | 8/2010 | Godet et al. | 250/423 R |
| 7,994,488 | B2 * | 8/2011 | Huang | 250/492.21 |
| 8,089,052 | B2 * | 1/2012 | Tieger et al. | 250/423 R |
| 8,101,510 | B2 * | 1/2012 | Godet et al. | 438/513 |
| 8,188,445 | B2 * | 5/2012 | Godet et al. | 250/423 R |
| 2006/0169922 | A1 * | 8/2006 | Chang et al. | 250/492.21 |
| 2007/0187620 | A1 * | 8/2007 | Jung et al. | 250/492.21 |
| 2010/0255683 | A1 * | 10/2010 | Godet et al. | 438/710 |
| 2011/0309049 | A1 * | 12/2011 | Papasouliotis et al. | 216/37 |
| 2012/0111834 | A1 * | 5/2012 | Godet et al. | 216/67 |

* cited by examiner

*Primary Examiner* — Bernard E Souw

(57) ABSTRACT

A method for treating a workpiece. The method includes directing a first ion beam to a first region of a workpiece, wherein the first ion beam has a first ion angular profile of first ions extracted through an aperture of an extraction plate. The method also includes directing a second ion beam to the first region of the workpiece, wherein the second ion beam has a second ion angular profile different than the first ion profile of second ions extracted through the aperture of the extraction plate.

16 Claims, 6 Drawing Sheets

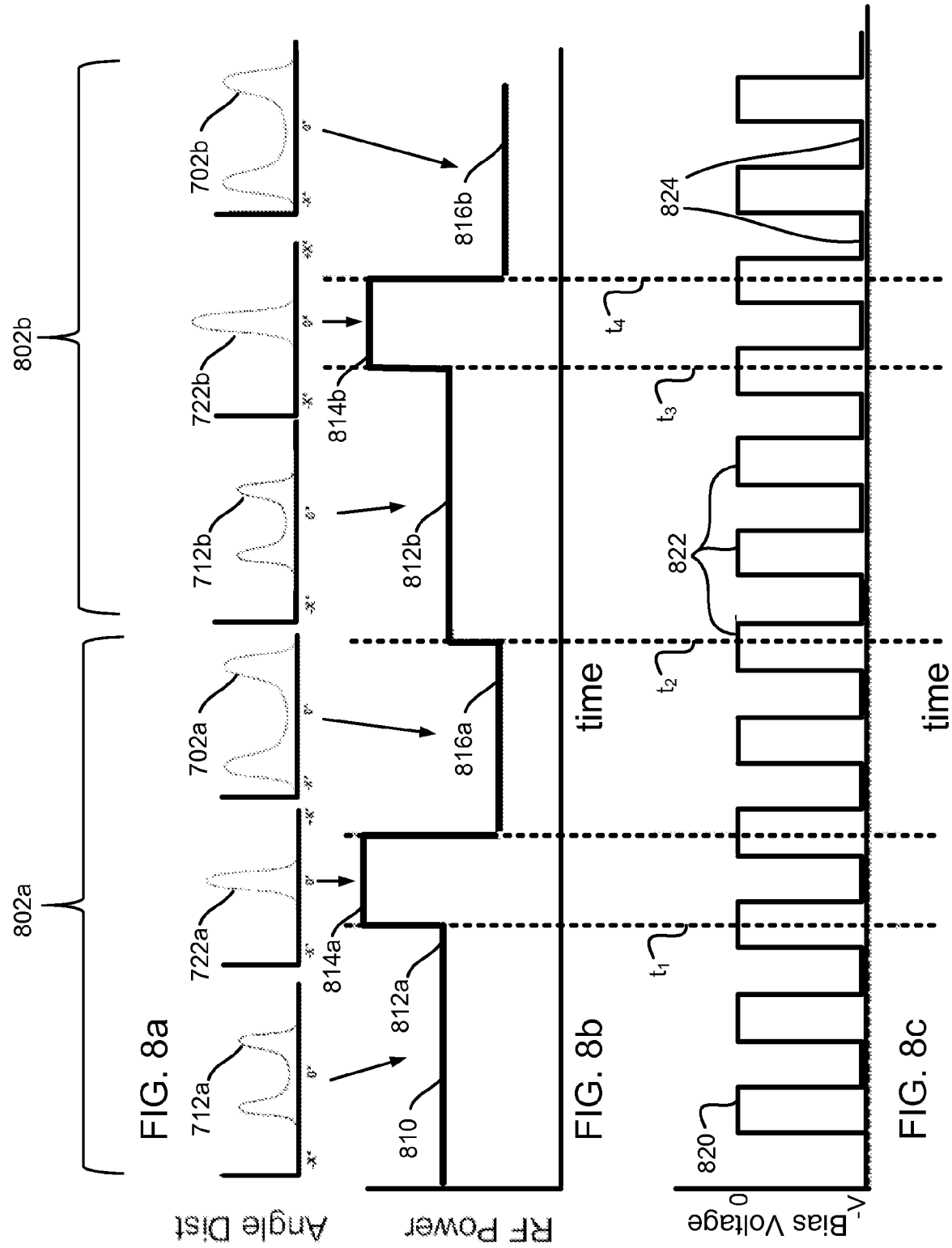

APPARATUS AND METHOD FOR THREE DIMENSIONAL ION PROCESSING

FIELD

This invention relates to the implantation of workpieces and, more particularly, to a method and apparatus for implantation of workpieces using multiple distributions of ions.

BACKGROUND

Ion implantation is a standard technique for introducing property-altering impurities into substrates. A desired impurity material is ionized in an ion source, the ions are accelerated to form an ion beam of prescribed energy, and the ion beam is directed at the surface of the substrate. The energetic ions in the beam penetrate into the sub-surface of the substrate material and are embedded into the crystalline lattice of the substrate material to form a region of desired conductivity or material property.

In conventional beamline ion implantation processes, ions are provided toward a substrate in beams that may comprise generally parallel ions. Thus, for a given substrate orientation with respect to the ion beam principle axis, the ions impinge at the same angle of incidence. This facilitates control of implantation of ions into the substrate since for any given substrate orientation, the direction of ion implantation is well characterized. However, when multiple angle implantations are desired, it is necessary to move the substrate orientation, beam direction, or both. Moreover, the ion beam generally covers a wide area of the substrate, requiring masking in order to implant only desired areas.

Recently, techniques and apparatus have been developed to provide ions to a substrate over a range of angles. FIG. 1 is a block diagram that depicts a processing system that provides ions at multiple angles to a substrate. The processing system 10 includes a plasma source 12, an extraction plate 14 (or sheath engineering plate), and a process chamber 16. A gas source 18 is connected to the process chamber 16. The plasma source 12 or other components of the processing system 10 also may be connected to a pump (not shown), such as a turbo-pump. As illustrated, the plasma source 12 is an RF plasma source with an RF generator 20, an RF matching network 22, and antenna 23. The plasma source 12 is surrounded by an enclosure 24 and an insulator 26 separates the enclosure 24 from the process chamber 16. The process chamber 16, plasma source 12, or workpiece holder 28 may be grounded.

The extraction plate 14 is used to form ion beam 30 for implantation into a workpiece 40, when a bias is applied between plasma 32 and workpiece 40. The extraction plate 14 may be cooled. The plasma source 12 may be biased and a bias power supply 52 may be provided to provide a continuous or pulsed bias on the substrate with respect to the plasma 32 to attract the ion beam 30. The extraction plate 14 may have at least one aperture 34, through which ion beam 30 is provided to the workpiece 40. Additional description related processing systems can be found in co-pending U.S. patent application Ser. Nos. 12/417,929, filed Apr. 3, 2009, and issued as U.S. Pat. No. 7,767,977; Ser. Nos. 12/418,120, filed Apr. 3, 2010; 12/644,103, filed Dec. 22, 2009; and 12/848,354, filed Aug. 2, 2010, each of which is herein incorporated in its entirety by reference.

An ion beam 30 extracted from a plasma using processing system 10 may be used to simultaneously provide to workpiece 40 the plasma 32 over a range of angles if desired without requiring complicated masking or lithography procedures. This ability to create a wide angular distribution of ions facilitates processing of substrates having three dimensional features where it may be desirable to simultaneously provide ions incident on the features from different directions. Moreover, the exact angular distribution of ion beam 30 that are provided to workpiece 40 may be established according to a specific set of ion beam optics conditions (parameters) in processing system 10. Parameters that may affect the angular distribution of ion beam 30 include the shape and size of aperture 34, the implantation voltage (the voltage difference between plasma 32 and workpiece 40), spacing between extraction plate 14 and workpiece 40, and plasma density. Thus, a specific set of parameters may establish a specific ion angular distribution of ion beam 30.

However, because the angular distribution of ion beam 30 may be sensitive to such parameters as plasma density, the angular distribution may be subject to change over time as operating parameters or conditions within processing system 10 drift. Moreover, certain angular distributions of ions may not be achievable using processing system 10 according to any single set of control parameters of processing system 10.

In view of the above, it will be appreciated that it may be useful to provide improvements to control the angular distribution of ions in ion implantation systems.

SUMMARY

In one embodiment, a method of treating a workpiece includes directing a first ion beam to a first region of a workpiece, wherein the first ion beam has a first ion angular profile of first ions extracted through an aperture of an extraction plate. The method also includes directing a second ion beam to the first region of the workpiece, wherein the second ion beam has a second ion angular profile different than the first ion profile of second ions extracted through the aperture of the extraction plate.

In another embodiment, a processing system includes an RF generator configured to send an RF signal to generate a plasma and a workpiece holder configured to receive a bias with respect to the plasma to attract ions across a plasma sheath toward a workpiece. The processing system also includes an extraction plate having an aperture configured to provide an ion beam having ions distributed over a range of angles of incidence on the workpiece. The processing system further includes a controller configured to send control signals to the RF generator to change amplitude of the RF signal in an alternating fashion between a first amplitude and a second amplitude, in a series of exposure cycles that each comprise a first and a second exposures of ions, each first and second exposure of ions corresponding to the respective first and second amplitudes and comprising a respective first and a second ion angular profile of ions extracted through the aperture.

BRIEF DESCRIPTION OF THE DRAWINGS

For a better understanding of the present disclosure, reference is made to the accompanying drawings, which are incorporated herein by reference and in which:

FIG. 7b depicts an exemplary ion angular profile that represents the sum of the ion angular profiles of FIG. 7a;

FIG. 8a illustrates a sequence for providing the ion angular profiles of FIG. 7a;

FIG. 8b depicts a power curve that comprises power levels of a plasma corresponding to the ion angular profiles of FIG. 8a; and FIG. 8c depicts an exemplary bias voltage pulse train that may be applied together with the power curve of FIG. 8b.

DETAILED DESCRIPTION

Embodiments of a system and method are described herein in connection with implantation of workpieces (substrates). In various embodiments, this system can be used with, for example, semiconductor substrates, bit-patterned media, solid-state batteries, or flat panels. Thus, the invention is not limited to the specific embodiments described below.

In various embodiments, an ion implantation system includes a plasma source, an extraction plate to direct an ion beam having ions distributed over a range of angles of incidence to a substrate, and a control system configured to tune and tailor the angular distribution of ion angles. In various embodiments, the controller may operate to adjust specific parameters of the ion implantation system in order to obtain and/or maintain an angular distribution of ions (hereinafter referred to as "angular ion profile"). In some embodiments, the controller may operate to rapidly vary plasma power of the ion implantation system such that the angular ion profile is varied over millisecond or microsecond timescales among multiple angular ion profiles. In this manner, a composite angular ion profile may be provided to the substrate that represents a distribution not achievable in any simple ion angular profile.

Figure 1:
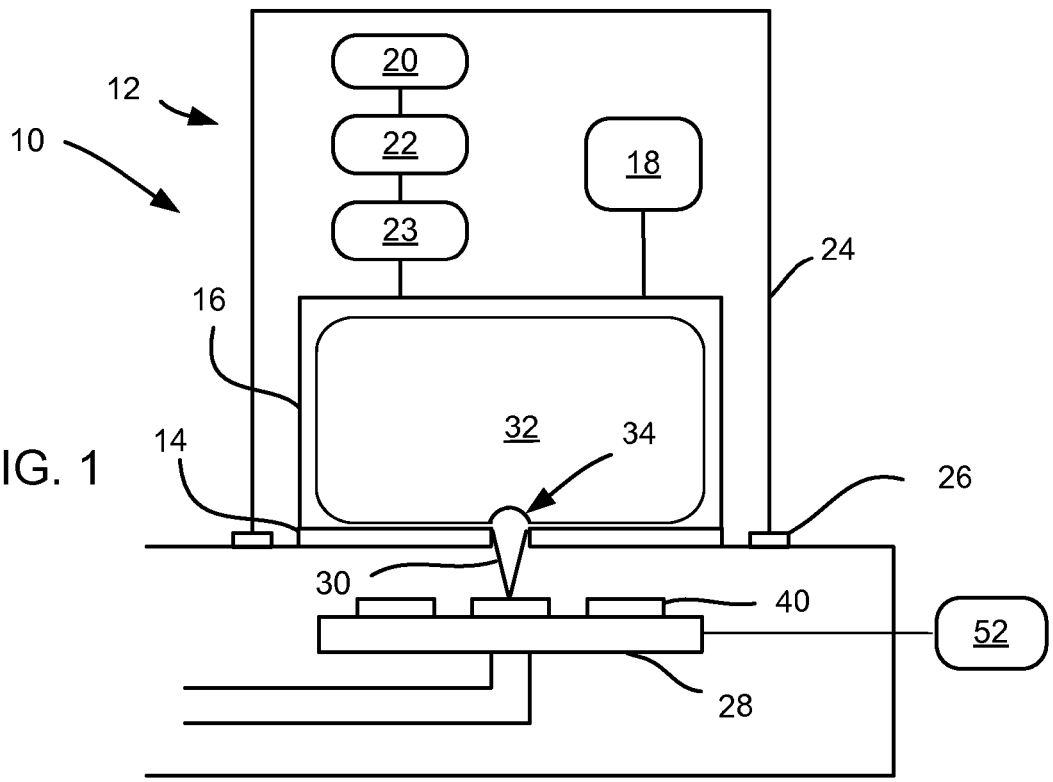
FIG. 1 is a block diagram of a processing system using a single aperture.
Figure 2:
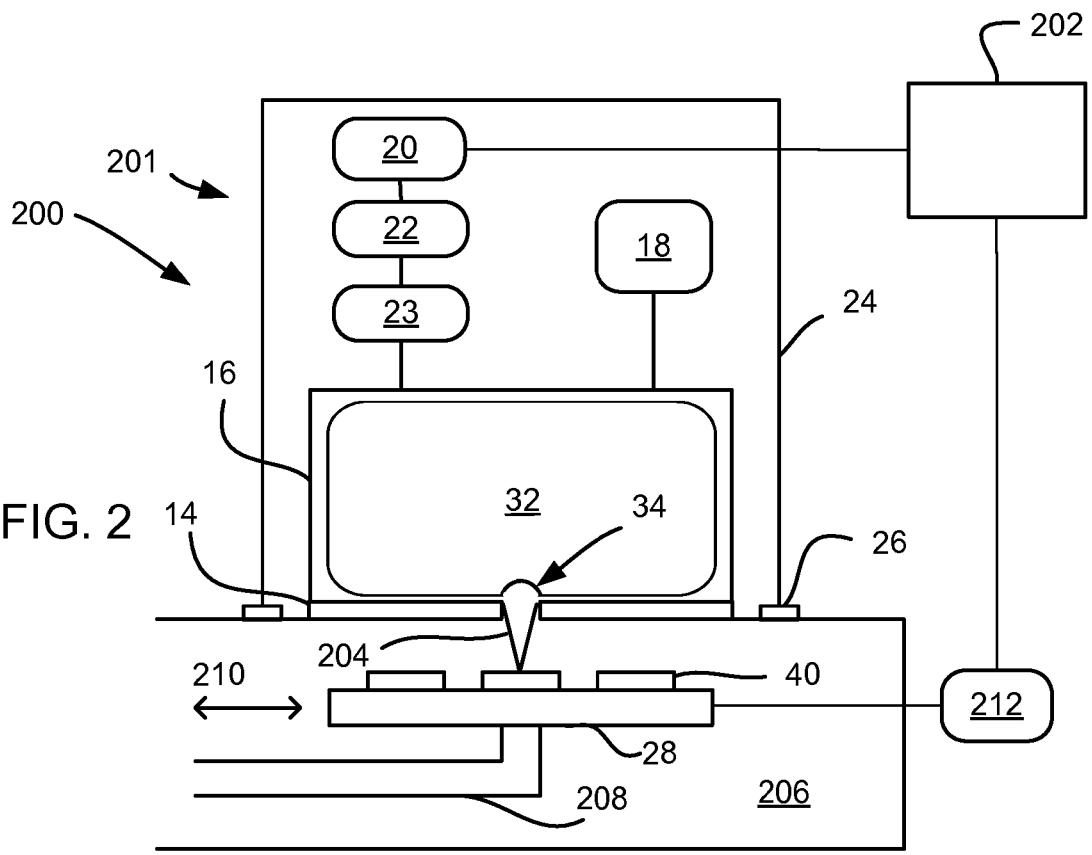
FIG. 2 is a processing system consistent with an embodiment of this disclosure.

FIG. 2 depicts a processing system 200 consistent with embodiments of this disclosure. Processing system 200 includes a plasma source 201 to generate a plasma 32 in a process chamber 16. Plasma source 201 may be an RF plasma source, inductively-coupled plasma (ICP) source, indirectly heated cathode (IHC), helicon, glow discharge source, or other plasma sources known to those skilled in the art. An extraction plate 14 may be arranged along an edge of plasma 32 with one or more apertures 34 through which an ion beam 204 may be extracted. A bias voltage may be applied between workpiece holder 28 and plasma 32 using bias voltage supply 212 to define an ion energy and dose of ions extracted through aperture 34 and impinging on workpiece 40, which may be a semiconductor substrates in some embodiments. The workpiece holder 28 may receive a voltage potential that biases the workpiece holder 28 with respect to the plasma 32 in different ways. In one embodiment, the workpiece holder 28 may receive a ground potential and a positive voltage may be applied to the plasma (source), while in another embodiment, the workpiece may receive a negative voltage and the plasma (source) may be set at ground potential or at a more positive voltage than the workpiece holder. Processing system 200 also includes a controller 202, which may control plasma power and bias applied to workpiece holder 28, as described below.

Processing system 200 also includes a workpiece chamber 206 that contains the workpiece holder 28 for supporting the workpiece 40. Processing system 200 may also include a scanning device 208 that provides for workpiece holder 28 to be moved along a direction 210 with respect to extraction plate 14. In some embodiments, extraction plate 14 may be stationary, while workpiece holder 28 is movable (for example, using a scanning device 208), while in other embodiments, extraction plate 14 may be movable while workpiece holder 28 is stationary, while in still other embodiments, both workpiece holder 28 and extraction plate 14 may be movable.

Figure 3:
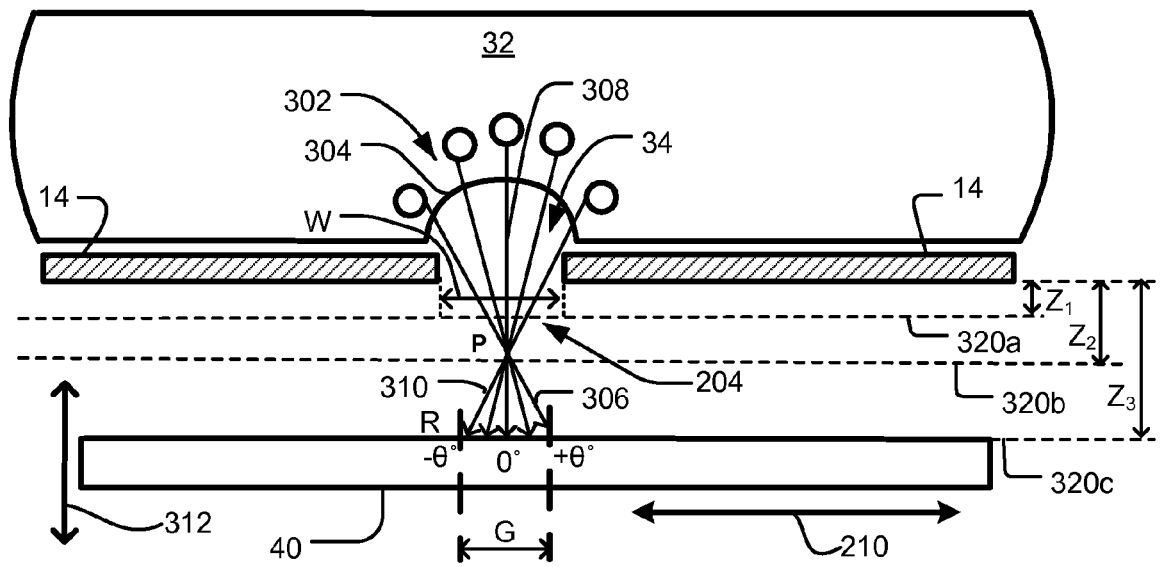
FIG. 3 depicts details of ion beam geometry for an extraction plate embodiment.

FIG. 3 depicts details of ion beam geometry for ion beams produced by processing system 200 using extraction plate 14 according to various embodiments. The extraction plate 14 is configured to modify an electric field within the plasma sheath 302 to control a shape of a plasma sheath boundary 304 proximate aperture 34 between plasma 32 and the plasma sheath 302. In this example, the plasma sheath boundary 304 has a convex shape with respect to the plane of workpiece 40. Ions in ion beam 204 that are attracted from the plasma 32 across the plasma sheath 302 may strike the workpiece 40 at a large range of incident angles. Several different trajectories of ions accelerated from plasma sheath boundary 304 are illustrated. Ions in ion beam 204 may be attracted from the plasma 32 across the plasma sheath 302 by different mechanisms. In one instance, the workpiece 40 is biased to attract ions of ion beam 204 from the plasma 32 across the plasma sheath 302. The ions of ion beam 30 may be a p-type dopant, an n-type dopant, hydrogen, a noble gas, or other species known to those skilled in the art.

When the workpiece 40 is biased, the ions 20 are attracted across the plasma sheath 302 through aperture 34. For instance, ions following trajectory path 306 may strike the workpiece 40 at an angle of $+\theta°$ relative to the plane 320c. Ions following trajectory path 308 may strike the workpiece 40 at about an angle of 0° relative to the same plane 320c. Ions following trajectory path 310 may strike the workpiece 40 at an angle of $-\theta°$ relative to the plane 320c. Accordingly, the range of incident angles may vary over a wide range and may be between $+60\,\theta°$ and $-60\,\theta°$ centered about 0° in some embodiments. In addition, some ion trajectories such as paths 306 and 310 may cross each other. Depending on a number of factors including, but not limited to, the horizontal dimension W of aperture 34, the vertical spacing (Z) of extraction plate 14 above workpiece 40, the dielectric constant of the extraction plate 14, or other process parameters of the plasma 32, the range of incident angles ($\theta$) may vary.

As further depicted in FIG. 3, in different embodiments extraction plate 14 may be positioned at different vertical spacings (Z) between the workpiece 40 and extraction plate 14 along direction 312, which is normal to a plane 320c defined by the front (top) surface of the workpiece 40. Depending on the separation Z, the shape and width of ion beam 204 may vary. For example, at a separation $Z_3$ corresponding to plane 320c, ion beam 204 may first form a focus at point P and diverge to form a spread-out beam having a width G when it impacts substrate 100. On the other hand, if the separation is arranged to be at plane 320b, corresponding to focal plane P, the ion beam 124 may form a narrow beam width when impacting substrate 100. At a separation $Z_1$ corresponding to plane 320a, a convergent ion beam 204 may impact substrate 100 in a wider area than at point P, as illustrated.

In addition to variations in Z, in further embodiments other parameters may be varied to alter the beam shape and size of ion beam 204. These parameters include, among others, the aperture width (or aperture diameter in the case of circular apertures) W and the plasma density of plasma 32.

The distribution of ions in ion beam 204 at the top surface of workpiece 40 may be characterized in different ways. In one example the ion current density may be measured as a function of position to produce an ion beam current profile. Another manner of characterizing the ion beam 204 is by determining the ion angular profile, which is a curve that plots the relative number of ions as a function of angle of incidence of ions.

Figures 4A, 4B, 4C:
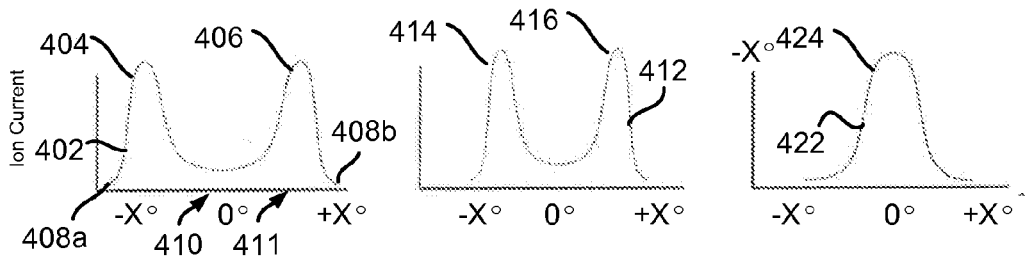
FIGS. 4a-4c depict exemplary ion angular profiles that may be produced by the system of FIG. 2.

FIGS. 4a-4c depict exemplary ion angular profiles 402, 412, and 422, which may be produced by a system, such as processing system 200 according to embodiments of the present disclosure. In some embodiments, the three different ion angular profiles may be produced by varying a single parameter of processing system 200, such as the plasma power applied to plasma 32. The plasma power may be directly related to plasma density in that higher power levels generally increase the ion and electron density in the plasma 32. By varying the plasma power, and thereby the plasma density, the thickness of plasma sheath 302 may be varied. In particular, increasing plasma density may cause a decrease in the thickness of plasma sheath 302. As the sheath thickness decreases, the ion angular profile changes from a more parallel distribution (422) to a wider ion angular profile (402, 412), or exhibits the opposite trend, depending on the given aperture width W. In addition, at a given sheath thickness, increasing width W results in a more parallel distribution of ions. Thus, for certain aperture widths W, the sequence of ion angular profiles 402, 412, and 422 may be produced by monotonically increasing the plasma density (decreasing plasma sheath 302 thickness), while for other aperture widths W, the sequence of ion angular profiles 402, 412, and 422 may be produced by monotonically decreasing the plasma density (increasing plasma sheath 302 thickness).

In particular, ion angular profile 402 exhibits a wide range of angles of incidence from –X° to +X° that forms a bimodal distribution, in which two peaks 404 and 406 are distributed on either side of normal incidence angle (0°). This indicates that a larger fraction of ions impinge on workpiece 100 at angles substantially different from normal incidence. At normal incidence, the ion angular profile 402 shows a minimum, indicating that fewer normal incidence ions impinge upon the substrate 100 than ions incident at other angles. Ion angular profile 412, which may correspond to an ion beam produced at a different power level than that used to produce ion angular profile 402, exhibits a qualitatively similar shape to that of ion angular profile 402, in that the distribution has two peaks 414 and 416. In this case, the peak separation may be smaller than for ion angular profile 402, indicating that the peak incidence angles corresponding to peaks 414, 416 are closer to normal than peaks 404 and 406. In contrast, ion angular profile 422 exhibits a monomodal distribution (single peak) 424 centered at normal incidence and showing a relatively narrower distribution of ion angles, indicative of a more parallel ion beam, as noted above.

Referring again to FIG. 2, in various embodiments, parameters of processing system 200 are varied to establish a desired ion angular profile for processing a workpiece. In some embodiments, a target ion angular profile for an ion beam process, such as ion implantation may be set and periodically reset to ensure uniform processing of wafers according to the desired process. In particular, the ion beam 204 may be measured and the operating parameters of processing system 200 adjusted until one or more target ion angular profiles are established for ion beam 204, as described below with respect to FIGS. 5 and 6. This adjustment may take place before an implantation process is to commence and may be performed at desired intervals to account for possible drift in system parameters or changes in the system that may otherwise alter the ion beam 204.

Once one or more target ion angular profiles are established, ion implantation of workpieces may commence by applying the experimental values of the relevant parameters used to establish the target ion angular profiles to the processing system 200. In various embodiments, multiple ion angular profiles may be combined to produce a composite ion angular profile, as described below with respect to FIGS. 7a, 7b. The latter approach affords the ability to produce novel ion angular profiles that may not otherwise achievable for a given processing system, such as processing system 200.

Figure 5:
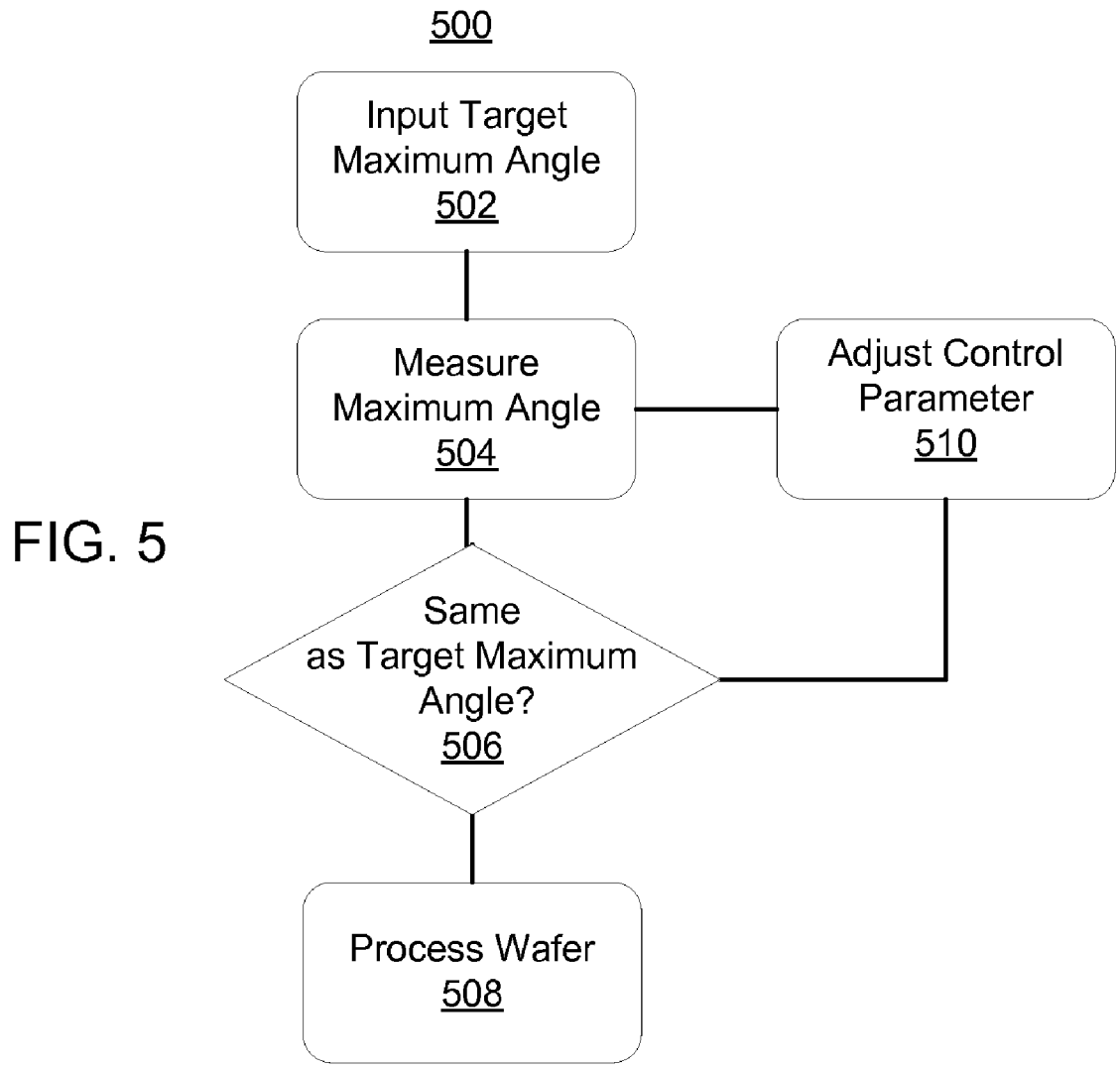
FIG. 5 depicts a method according to an embodiment of the disclosure.
Figure 6:
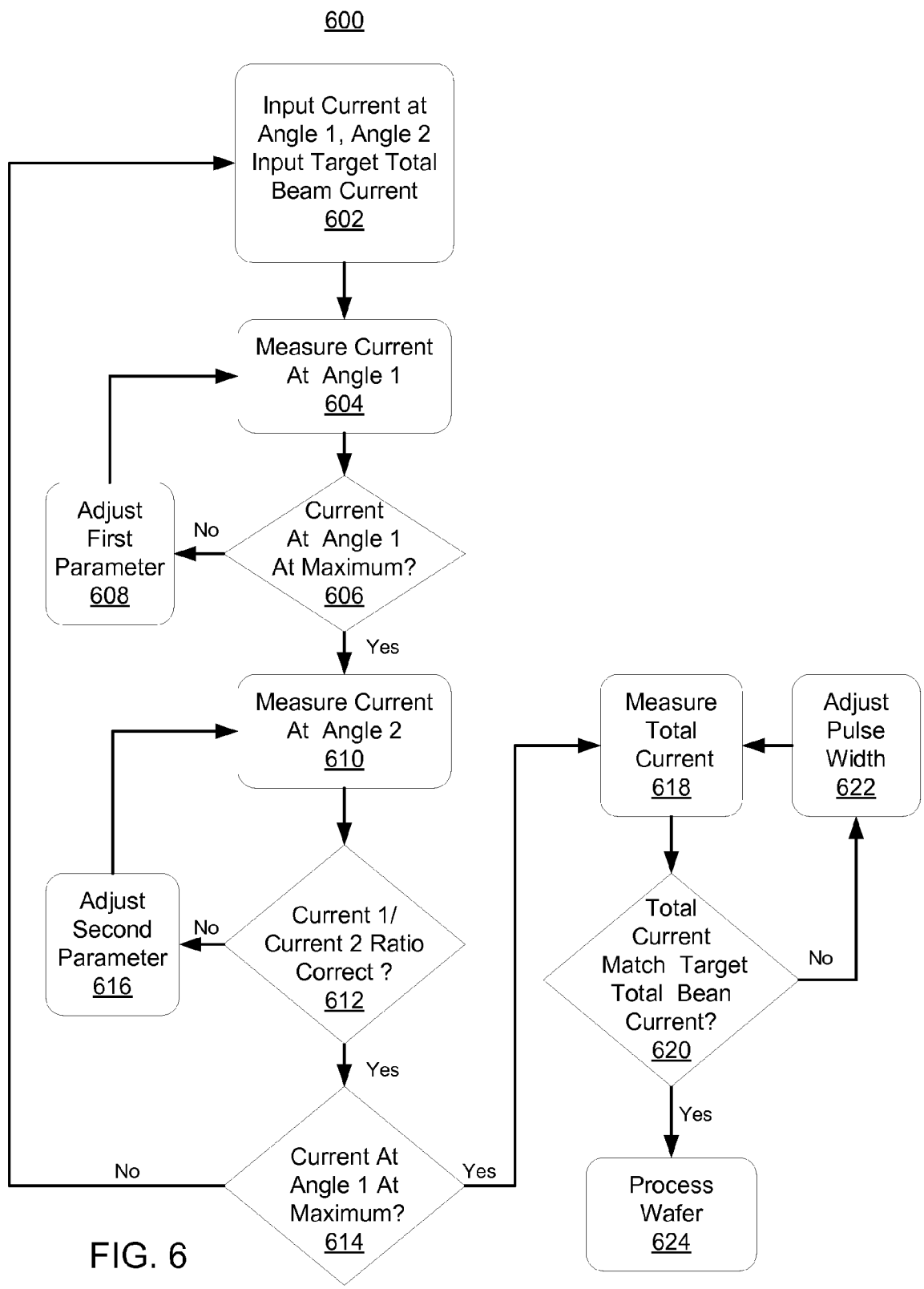
FIG. 6 depicts another method according to an embodiment of the disclosure.

Turning to FIG. 5, a method 500 is disclosed for tuning an ion angular profile according to some embodiments of the disclosure. In the discussion of FIGS. 5 and 6 to follow, the ion angular profile 402 of FIG. 4a will be referred to for purposes of illustration. At block 502, a target maximum angle for the ion angular distribution is input. For example, this value may be entered and stored in a memory of an ion implantation system. At block 504, a maximum angle of an ion angular profile of an ion beam is measured. As depicted in FIG. 4a, the maximum angle(s) 408a,b may represent the angle of ions whose trajectory forms the greatest angle with respect to a zero degree incidence (substrate normal). Thus, the maximum angle may correspond to ions incident on the workpiece at glancing angles. At block 506, if the measured maximum angle is the same as the target maximum angle, the method moves to block 508, where the wafer is processed. If the measured maximum angle does not match the target maximum angle, the method moves to block 510, where a relevant control parameter is adjusted. For example, if the measured maximum angle of the ion angular distribution is less than the target maximum angle, the applied plasma power of system may be adjusted. Referring once more to FIG. 3, an adjustment in plasma power to plasma 32 may alter the shape of plasma sheath boundary 304, thereby altering the distribution of angles of ions exiting the plasma, which may shift the maximum angle for the ion angular profile to the target value. The method then moves to block 504, after which further iterations of ion beam measurement and parameter adjustment may be performed until the target maximum angle is obtained.

FIG. 6 depicts exemplary steps in a method 600 of tuning an ion angular profile consistent with further embodiments. In this method, two or more parameters may be adjusted in an iterative process until a desired ratio of ion currents at different angles is achieved. This may be useful in cases where it is desirable to implant a certain fraction of ions at a first angle, such as a higher incidence angle and another fraction of ions at a lower incidence angle, such as zero degrees. Referring also to FIG. 4a, the ion angular profile 402 may be a target curve that represents the desired relative ion current as a function of angle θ. In one aspect, the ion angular profile may be partially defined by the ratio of ion current at two different angles 410 and 411. The angle 410 may correspond to zero degree incidence, that is, normal incidence, at which angle the relative ion current is to be low. In other words, the ion angular profile 402 may be employed in ion implantation processes in which implantation into a workpiece at normal incidence is to be minimized. The angle 411 may correspond to a desired angle for peak ion current, which may represent the preferred angle for ion implantation. As previously noted, the ion angular profile 402 is a bimodal distribution in which two peaks 404 and 406 are present, which may represent trajectories forming angles having the same absolute value with respect to normal incidence.

At block 602, the target current at a first angle and a second angle, as well as the target total ion beam current are input. These values may represent the target ion current at angles 411 and 410. At block 604, the current is measured at a first angle. The method then moves to block 606. If the current at the first angle does not represent the maximum current—in other words, if the angle 411 does not coincide with peak 406—the method moves to block 608, where a first parameter of a processing system is adjusted. The first parameter may be, for example, the plasma power. The method then moves to block 604 where the current at the first angle is measured again. If the first angle matches the peak 406, then the method moves to block 610.

When the current at the first angle corresponds to a maximum, at block 610, the current is measured at a second angle, which may be angle 410. The method then moves to block 612, where, based upon the measured current at the second angle, a ratio of the first and second current is determined. If this ratio corresponds to a target ratio, the method moves to block 614. For example, it may be desirable to have ten times as much ion current at the angle 411 as at the angle 410. If the ratio of measured current at angle 1 and angle 2 does not equal the target value, the method moves to block 616, where a second parameter of the ion implantation system is adjusted. The second parameter may be, for example, the separation Z between workpiece 40 and extraction plate 14. By adjusting the separation Z, the exact distribution of ions at the surface of a workpiece may be changed, as illustrated above with respect to FIG. 3. The method then moves back to block 610, where the current at the second angle is re-measured.

If the ratio of ion currents at the first and second angles meet the target value, the method moves to block 614. At block 614, if any adjustments have been made, a new determination is made as to whether the current at the first angle corresponds to a peak in ion current. If it does not, the method proceeds to block 602. If the current at the first angle constitutes a peak position, the method proceeds to block 618.

At block 618, the total ion current in the ion beam is determined. The total ion beam current may be determined by positioning a current detector to detect all ions over their total range of incidence on a workpiece for a fixed period of time. The method then proceeds to block 620 where, if the measured current does not match the target total ion beam current, the method proceeds to block 622. At block 622, a duty cycle of ions provided to the workpiece is adjusted. This may be accomplished by changing the pulse width of a bias voltage pulse applied to a workpiece holder. During "on" periods in which a bias voltage is applied to the workpiece holder so as to attract ions from the plasma, the ion beam is accelerated through an aperture of an extraction plate and impinges upon the workpiece. During the "off" periods in which no bias voltage is applied to the workpiece, the ions in a plasma chamber may not be accelerated towards the workpiece. Accordingly, the relative duration of "on" periods, and therefore the relative amount of ion flux averaged over a period of time, may be adjusted by changing the width of a bias voltage pulse while keeping the pulse cycle period (the total of "on" and "off" periods) constant.

After the block 622, the method proceeds back to block 618 where the total ion beam current is remeasured. If, at block 620 the total measured ion current matches a target value, the method proceeds to block 624 where a wafer (workpiece) is processed according to the currently established parameters of the processing system. The parameters cause the processing system to direct to the workpiece an ion beam having the target ion angular profile and total beam current. In some embodiments, the method 600 may be repeated for additional angles until an entire ion angular profile is produced.

In accordance with the method 600, both the ion angular profile and the ion dose directed to a workpiece may be periodically checked and adjusted to ensure consistency of both ion dose and ion angular profile. In various embodiments, the adjustments in operating parameters for the methods 500 and 600 may take place over the scale of milliseconds or seconds. Accordingly, in some embodiments the adjustments may be applied at the beginning of an ion implantation process or between implantation of successive wafers or between batches of wafers.

Figure 7A:
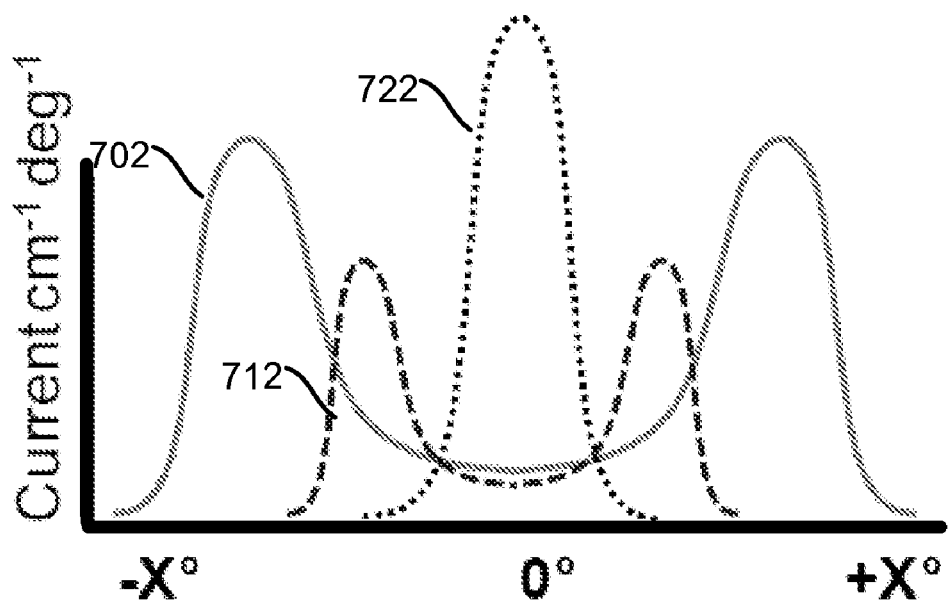
FIG. 7a depicts exemplary ion angular profiles that may be produced by the system of FIG. 2, superimposed on the same axis.
Figure 7B:
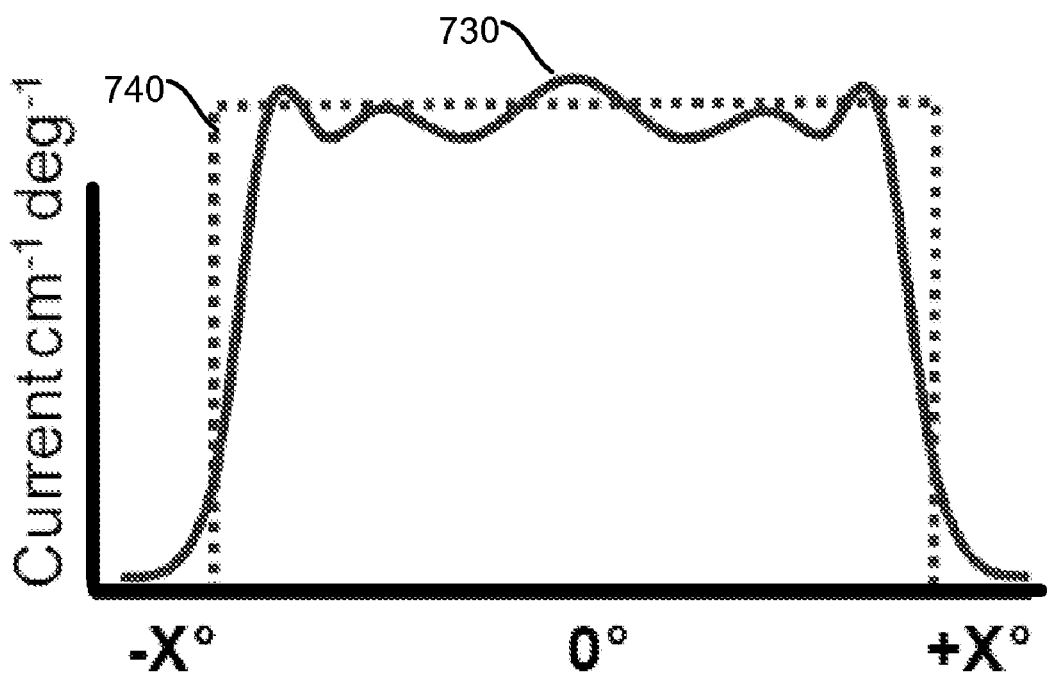

In some embodiments, multiple ion angular profiles may be combined to form a composite ion angular profile of ions that are directed to a workpiece. For example, in some embodiments, a first and a second ion angular profile may be combined to form a third ion angular profile. In other embodiments, a first, second, and third ion angular profile may be combined to form a fourth ion angular profile, as illustrated in FIGS. 7a and 7b. FIG. 7a illustrates three ion angular profiles, in which each individual ion angular profile 702, 712, and 722 may represent a profile obtained at a different plasma density for processing system 200. For example, as with ion angular profiles 402, 412, and 422, the three ion angular profiles 702, 712, and 722 may correspond to those obtained at three different plasma power levels of the processing system 200. However, if a flat ion angular profile such as ion angular profile 740 is desired, it will be apparent that none of the plasma power levels corresponding to ion angular profiles 702, 712, and 722 is close to the desired ion angular profile 740.

However, referring now to FIG. 7b, the composite ion angular profile 730, which represents a sum of the three individual ion ion angular profiles 702, 712, and 722, does approximate the desired ion angular profile 740. In particular embodiments, the composite ion angular profile 730 may be provided to a workpiece by switching operating conditions of the processing system 200 between a first, second, and third plasma power level.

It will be apparent that the composite ion angular profile 730 is not provided to a workpiece at any given instant in time. In other words, composite ion angular profile 730 represents three different exposures to ions having three different ion angular profiles that occur over three respective separate time periods. However, by rapidly adjusting a select parameter that controls the ion angular profile, the three different ion angular profiles may be provided in rapid succession to a workpiece. The workpiece may be effectively exposed to the composite ion angular profile 730 in a manner that has the same effect on the workpiece as if a single ion angular profile having the shape of composite ion angular profile 730 were instantaneously provided to the substrate.

An advantage of providing multiple ion angular profiles to produce a composite ion angular profile is that the composite ion angular profile may present a profile that is not achievable in a single ion angular profile. In particular, the type of ion angular profiles achievable as a single ion angular profile may be constrained to certain shapes given the ion beam optics of a system. In contrast, the present embodiments provide a means to construct a desired ion angular profile based on rapidly exposing a workpiece to different individual ion angular profiles. For example, the shape of the individual ion angular profiles 702, 712, and 722 show that at low plasma power very little ion flux is directed at normal incidence (zero degrees), while at high power the ion flux is peaked at normal incidence, but forms a very narrow distribution. In no case does a flat profile occur that extends over a wide angular range. However, by adding together the individual ion angular profiles 702, 712, and 722, the composite ion angular profile 730 provides a reasonable approximation of the wide, flat angular distribution of ion angular profile 740.

More generally, embodiments of the present invention provide for combining any desired number of individual ion angular profiles to form a composite ion angular profile of a desired shape. For example, in different embodiments, 5, 10 or 20 individual ion angular profiles may be combined by rapidly varying the plasma power between plasma power setpoints corresponding to each profile, for example varying the plasma power setpoint on a the timescale of microseconds to about one hundred milliseconds.

FIGS. 8a-8c illustrate an embodiment of a method of exposing a workpiece to multiple ion angular profiles. As noted with respect to FIGS. 7a, 7b, the ion angular profiles 702, 712, and 722 may be combined in such a manner as to provide a composite ion angular profile. FIG. 8a illustrates the sequence for providing ion angular profiles. In the sequence illustrated, each ion angular profile 702, 712, and 722 is provided in succession in a series of two exposure cycles 802a, 802b. Each single exposure cycle 802a, 802b comprises one exposure each to ions distributed over ion angular profiles 702, 712, and 722. In accordance with various embodiments, the exposure cycles 802a, 802b may be repeated multiple times during processing of a workpiece. Thus, each exposure cycle comprises an exposure of a workpiece to composite ion angular profile 730. In the embodiment of FIGS. 8a-8c, each exposure cycle 802a, 802b may take place for the same amount of time.

FIGS. 8b and 8c depict the respective plasma power curve of a plasma and workpiece bias curve that are interoperable to produce the exposure cycles 802a, 802b. In particular, FIG. 8b depicts a plasma power curve 810 that comprises different RF power levels. The different plasma power levels may be established by an RF generator, which may vary amplitude of an RF signal sent to an antenna (see antenna 23 of FIG. 2) to alter the plasma power, thereby changing the plasma density. As shown in FIG. 8a, each ion angular profile 702, 712, 722 corresponds to a different RF power level of a plasma from which the ions are extracted. Thus, in portion 812a of plasma power curve 810, RF power is set at an intermediate power level, which produces the ion angular profile 712a, characterized by a relatively narrow bimodal distribution of angles of incidence about zero degrees. The portion 814a corresponds to a high RF power level that produces the single mode ion angular profile 722a. The portion 816a corresponds to a low RF power level that produces the ion angular profile 702a, which is a relatively wider bimodal distribution of angles of incidence. The sequence of intermediate-high-low power levels is repeated in portions 812b, 814b, and 816b. As further illustrated in FIG. 8b, the duration of exposure to ions may vary between different power levels. By varying the relative exposure time at different power levels, the shape of the composite ion angular profile may be further tuned. In other words, the composite ion angular profile 730 may be considered a weighted time average of individual ion angular profiles 702, 712, and 722. By varying the relative duration of exposure of the different ion angular profiles, the composite profile becomes more weighted to the one or more individual profiles having the greater duration.

FIG. 8c depicts an exemplary bias voltage pulse train 820 applied between a workpiece and plasma during the exposure to a plasma whose power is defined by plasma power curve 810. During "on" periods 824, a negative voltage pulse (−V) is applied and ions from the plasma are extracted from a plasma through an extraction plate and attracted to a workpiece at an energy defined by the bias voltage. During "off" periods 822, the pulse voltage is zero and the ions are not attracted to the workpiece and may not impinge on the workpiece. As a consequence, the ion angular profiles 702, 712, and 722 are produced during "on" periods 822 and are not produced during the "off" periods.

In accordance with some embodiments, the transition between different plasma power levels may be synchronized with the application of workpiece bias pulses such that the transition occurs during pulse "off" periods 822. For example, at time $t_1$, corresponding to the middle of an "off" period 822, a transition takes place between intermediate power level (portion 812a) and a high power level (portion 814b). Similarly, the times $t_2$, $t_3$, and $t_4$ correspond to transitions between different RF power levels, as shown. In some embodiments, the duration of "on" and "off" periods 824 and 822, respectively, may be on the order of 10 μs to about one ms. When the RF power level is varied from one level to another level the transition between different plasma densities in a plasma may take place over an interval on the order of 10 μs or so. Accordingly, by proper synchronization of plasma power curve 810 and bias voltage pulse train 820 the transition between different plasma densities (and therefore different ion angular profiles) may take place completely within the "off" period. In this manner, the proper power level to create each ion angular profile 702, 712, and 722 is completely established before an "on" period 824 of bias voltage pulse train 820 begins, thereby facilitating better control of the resultant composite ion angular profile.

In various embodiments, the duration of an exposure at a given RF power level may be on the order of a few μs to to a few ms. Thus, for example, portions 812a, 814a, and 816a may correspond to time intervals of 300, 100, and 200 μs, such that a single exposure cycle such as 802a lasts 600 μs. As noted above, in various embodiments, the exposure cycles 802a, 802b may be repeated multiple times. For example, referring again to FIG. 2, during exposure cycles 802a, 802b a workpiece 40 may be scanned with respect to aperture 34 so that the entire workpiece or large portions of the workpiece may be exposed to composite ion angular profile 730. While the workpiece 40 is scanned, a controller 202 may send signals to RF power supply 20 to periodically vary the power setpoint (level), and further control signals may be sent to bias voltage supply 212, thereby producing the plasma power curve 810 and bias voltage pulse train 820, which together produce the exposure cycles 802a, 802b.

Because each exposure cycle 802a, 802b may be of duration of microseconds or up to about one hundred milliseconds, many hundreds or thousands of exposure cycles may be performed while a workpiece 40 is scanned under aperture 34, which scanning may take up to many seconds. This may result in the workpiece "seeing" an effective ion angular profile represented by the composite ion angular profile, such as composite ion angular profile 730. For example, assuming a workpiece scan rate of 1 mm/s and an ion beam width at workpiece 40 of 5 mm, any point R on the workpiece 40 scans under the entire ion beam 204 in 5 seconds. Using the example of 600 μs duration for exposure cycle 802a, 802b, a total of about 8300 exposure cycles 802a, 802b are provided to workpiece 40 during the time that any point R traverses under ion beam 204. Thus, since the workpiece 40 may travel only a minute fraction of the ion beam width within the duration of an exposure cycle 802a, 802b (1/8300 in the present example) the composite ion angular profile 730 may be effectively provided to each region of workpiece 40 during scanning. The same goes for static exposures of workpieces in which the workpiece is stationary during exposure to exposure cycles 802a, 802b.

In addition to providing methods and systems for manipulating ion angular profiles for ion implantation, embodiments of the present disclosure encompass methods and systems for providing, adjusting, and maintaining ion angular profiles for ion beams that are used to treat workpieces for other purposes. In some embodiments, the ion angular profiles may be provided to a workpiece to treat three dimensional surface features. For example, a composite ion angular profile may be provided to treat a photoresist relief feature on a substrate surface or to amorphize portions of a three dimensional relief feature, among other embodiments.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In particular, steps for varying the DC extraction voltage and/or workpiece scan rate may be performed at least partially by a combination of an electronic processor, computer readable memory, and/or computer readable program. The computer memory may be further configured to receive, display and store process history information associated with operation of a plasma system and as exemplified by the stored voltage values.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method of treating a workpiece, comprising:
   directing a first ion beam to a first region of a workpiece, the first ion beam having a first ion angular profile of first ions extracted through an aperture of an extraction plate; and
   directing a second ion beam to the first region of the workpiece, the second ion beam having a second ion angular profile different than the first ion profile of second ions extracted through the aperture of the extraction plate.

2. The method of claim 1, comprising providing each of the first and second ion angular profiles multiple times for respective first and second periods that each comprise a duration of less than about 100 milliseconds.

3. The method of claim 2, wherein the first period differs from the second period.

4. The method of claim 1, further comprising providing the first and second ion angular profiles multiple times in an alternating fashion.

5. The method of claim 1, wherein the first ion angular profile is a monomodal profile and the second ion angular profile is a bimodal profile.

6. The method of claim 1, further comprising:
   optimizing the first ion angular profile before directing the first ion angular profile towards the workpiece, the optimizing comprising:
   measuring a first experimental maximum angle of the first ion angular profile;
   comparing the first experimental maximum angle to a first target maximum angle; and
   adjusting control parameters if the first experimental maximum angle differs from the first target maximum angle.

7. The method of claim 6, further comprising:
   optimizing the second ion angular profile before providing the second ion angular profile, the optimizing comprising:
   measuring a second experimental maximum angle of the second ion angular profile;
   comparing the second experimental maximum angle to a second target maximum angle; and
   adjusting control parameters if the second experimental maximum angle differs from the second target maximum angle.

8. The method of claim 1, further comprising
   optimizing the first ion angular profile before directing the first ion angular profile towards the workpiece, the optimizing comprising:
   measuring a first current at a first target angle;
   performing a first adjustment to control parameters of the ion implantation system if the first current does not represent a current peak;
   measuring a second current at a second target angle; and
   performing a second adjustment to the control parameters of the ion implantation system if a ratio of the first current to the second current does not match a target ratio.

9. The method of claim 8, further comprising: after the second adjustment,
   measuring a total ion current of the first ion profile; and
   adjusting a duty cycle of an extraction pulse sequence if the total ion current differs from a target total ion current.

10. The method of claim 1, wherein a sum of the first and second ion angular profiles comprises a third ion profile, the method further comprising scanning the workpiece with respect to the extraction plate while providing the third ion profile to the workpiece.

11. The method of claim 1, the providing the first and second ion angular profiles comprising sending a first RF signal at a first amplitude and a second RF signal at a second amplitude from an RF generator to an antenna.

12. The method of claim 11, further comprising providing a bias voltage pulse train to the workpiece, wherein the first and second ion angular profiles are established during on periods of the bias voltage pulse train in which ions are attracted to the workpiece, and wherein a transition between the first and second power levels takes place during an off period of the bias voltage pulse train in which ions are not attracted to the workpiece.

13. The method of claim 1, further comprising providing to the first region of the workpiece a fourth ion profile of third ions different than the first and second ion profiles of respective first and second ions extracted from the extraction plate.

14. A processing system, comprising:
   an RF generator configured to send an RF signal to generate a plasma;

a workpiece holder configured to receive a bias with respect to the plasma to attract ions across a plasma sheath toward a workpiece;

an extraction plate having an aperture configured to provide an ion beam having ions distributed over a range of angles of incidence on the workpiece; and a controller configured to send control signals to the RF generator to change amplitude of the RF signal in an alternating fashion between a first amplitude and a second amplitude, in a series of exposure cycles that each comprise a first and a second exposure of ions, each first and second exposure of ions corresponding to the respective first and second amplitudes and comprising a respective first and a second ion angular profile of ions extracted through the aperture.

15. The plasma processing system of claim 14, wherein the workpiece holder is configured to scan a workpiece with respect to the aperture of the extraction plate during a series of exposure cycles, wherein each exposure cycle is less than about ten percent of a duration required for the workpiece to scan a distance equal to a width of the ion beam.

16. The plasma processing system of claim 14, wherein the first exposure is longer than the second exposure.

* * * * *